United States Patent
Lee

(10) Patent No.: US 7,332,098 B2
(45) Date of Patent: Feb. 19, 2008

(54) PHASE SHIFT MASK AND FABRICATING METHOD THEREOF

(75) Inventor: Jun Seok Lee, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 393 days.

(21) Appl. No.: 11/024,435

(22) Filed: Dec. 30, 2004

(65) Prior Publication Data

US 2005/0139575 A1    Jun. 30, 2005

(30) Foreign Application Priority Data

Dec. 31, 2003  (KR) .................. 10-2003-0101888

(51) Int. Cl.
*B44C 1/22* (2006.01)
*G03F 1/00* (2006.01)

(52) U.S. Cl. .................. 216/12; 216/46; 216/47; 430/4

(58) Field of Classification Search .............. None
See application file for complete search history.

(56) References Cited

U.S. PATENT DOCUMENTS

| 5,935,735 | A  | * | 8/1999  | Okubo et al. ............... 430/5 |
| 6,037,083 | A  | * | 3/2000  | Mitsui ....................... 430/5 |
| 6,599,667 | B2 | * | 7/2003  | Yusa et al. ................. 430/5 |
| 6,869,736 | B2 | * | 3/2005  | Nakagawa et al. .......... 430/5 |
| 2002/0039689 | A1 | * | 4/2002 | Yusa et al. ................. 430/5 |
| 2004/0197679 | A1 | * | 10/2004 | Yoshikawa et al. ......... 430/5 |
| 2005/0139575 | A1 | * | 6/2005 | Lee ........................... 216/12 |

* cited by examiner

*Primary Examiner*—Allan Olsen
(74) *Attorney, Agent, or Firm*—Lowe Hauptman Ham & Berner LLP

(57) ABSTRACT

The present invention provides a phase shift mask and fabricating method thereof, by which a critical dimension of a semiconductor pattern can be accurately formed in a manner of compensating a boundary step difference between an active area and an insulating layer. The present invention includes a transparent substrate and at least two halftone layers on the transparent substrate to have light transmittance lower than that of the transparent substrate, each comprising front and rear parts differing in thickness from each other.

6 Claims, 6 Drawing Sheets

PHASE SHIFT MASK AND FABRICATING METHOD THEREOF

BACKGROUND OF THE INVENTION

1. Field of the Invention

The present invention relates to a phase shift mask and fabricating method thereof, by which a critical dimension of a semiconductor pattern can be accurately formed in a manner that compensates for a boundary step difference between an active area and an insulating layer.

2. Discussion of the Related Art

Generally, a mask pattern forming technique is closely related to a precision of a real pattern formed on a semiconductor substrate. Specifically, if a degree of semiconductor pattern integration is very high, a remaining space for inserting an OPC (optical proximity correction) pattern therein is insufficient, and consequently a line width bridge between patterns unexpectedly occurs regardless of lithography exposure intention, and various device characteristic are degraded.

In semiconductor photolithography, a precise design of a photomask enables a quantity of light transmitted via the photomask to be appropriately adjusted. For the precise design of the photomask, OPC, phase shift masking, and the like has been proposed as well as various methods for minimizing the light distortion attributed to a shape of the pattern drawn on a mask.

Lately, a chemically amplified resist having excellent sensitivity to far infrared ray wavelength (248~194 nm) has been developed to substantially enhance resolution. And, the resolution enhancement is attributed to a technique of forming a supplementary (dummy) pattern separated from the real pattern to control an optical proximity effect.

FIG. 1 is a layout of a mask according to a related art, in which a logic device part is shown.

Referring to FIG. 1, a logic device part of a mask consists of a square type active area shield pattern 2 on a transparent substrate 1 and a pair of bar type gate shield patterns 3 and 4 on the active area shield pattern 2 to be overlapped with the active area shield pattern 2. Each end of the gate shield patterns 3 and 4 protrudes outside from a rim of the active area shield pattern 2 to a prescribed length L.

FIG. 2 is a layout of a semiconductor device formed using the mask in FIG. 1, and FIG. 3 is a cross-sectional diagram along a cutting line A-A in FIG. 2.

Referring to FIG. 2, an insulating layer 11 and an active layer 12 are formed on a substrate 10 to correspond to the transparent substrate 1 and the active area shield pattern 2 of the mask, respectively. Namely, the active layer 12 is formed on the substrate 10 to have the same shape of the active area shield pattern 2 of the mask and the insulating layer 11 is formed to enclose the active layer 12 to correspond to the transparent substrate 1 of the mask.

Gate patterns 13 and 14 are formed on the insulating layer 11 and the active layer 12 to correspond to the gate shield patterns 3 and 4 of the mask. Specifically, front ends of the gate patterns 13 and 14 protrude from a boundary of the active layer 12 to a prescribed length L' like the shield patterns 3 and 4.

Compared to the protruding front end length L of each of the gate shield patterns 3 and 4 of the mask, the protruding end length L' of each of the gate patterns 13 and 14 is shortened due to the optical proximity effect and the boundary step difference between the insulating layer 11 and the active layer 12.

However, if the front end length of the gate pattern 13 or 14 is shortened, it is not possible to secure a process margin of the active layer 12, and a gate threshold voltage is raised.

SUMMARY OF THE INVENTION

Accordingly, the present invention is directed to a phase shift mask and fabricating method thereof that substantially obviates one or more of the above-identified and other problems due to limitations and disadvantages of the related art.

An object of the present invention is to provide a phase shift mask and fabricating method thereof, in which light transmittance is varied in a manner of differentiating a thickness of a halftone layer according to an area and by which a critical dimension of a semiconductor pattern can be accurately formed in a manner of compensating a boundary step difference between an active area and an insulating layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with one purpose of the invention, as embodied and broadly described herein, a phase shift mask is provided to include a transparent substrate, and at least two halftone layers on the transparent substrate. The two halftone layers have light transmittances lower than that of the transparent substrate, and each includes front and rear parts differing in thickness from each other.

According to one aspect of the invention, a light transmittance difference between the front and rear parts is 2~8%.

In another aspect of the present invention, a method of fabricating a phase shift mask includes the steps of forming a halftone layer on a transparent substrate, forming a first photoresist pattern on the halftone layer to define at least two areas, patterning the halftone layer using the first photoresist pattern into a first halftone layer and a second halftone layer, removing the first photoresist pattern, forming a second photoresist pattern covering the first halftone layer only on the transparent substrate, etching the second halftone layer and an exposed surface of the transparent substrate to a first thickness and a second thickness, respectively, and removing the second photoresist pattern.

Preferably, the second photoresist pattern includes a pair of inclines covering sidewalls of the first halftone layer with prescribed slopes, respectively.

More preferably, the etched surface of the transparent substrate has a recessed incline having a same slope of the prescribed slope of the incline of the second photoresist pattern.

Preferably, the halftone layer forming step includes the steps of forming a phase shift layer on the transparent substrate and forming a shield layer on the phase shift layer.

More preferably, the phase shift layer and the shield layer are formed on MoSiN and Cr, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 4 to 8 are cross-sectional diagrams for explaining a method of fabricating a phase shift mask according to the present invention.

Figure 1:
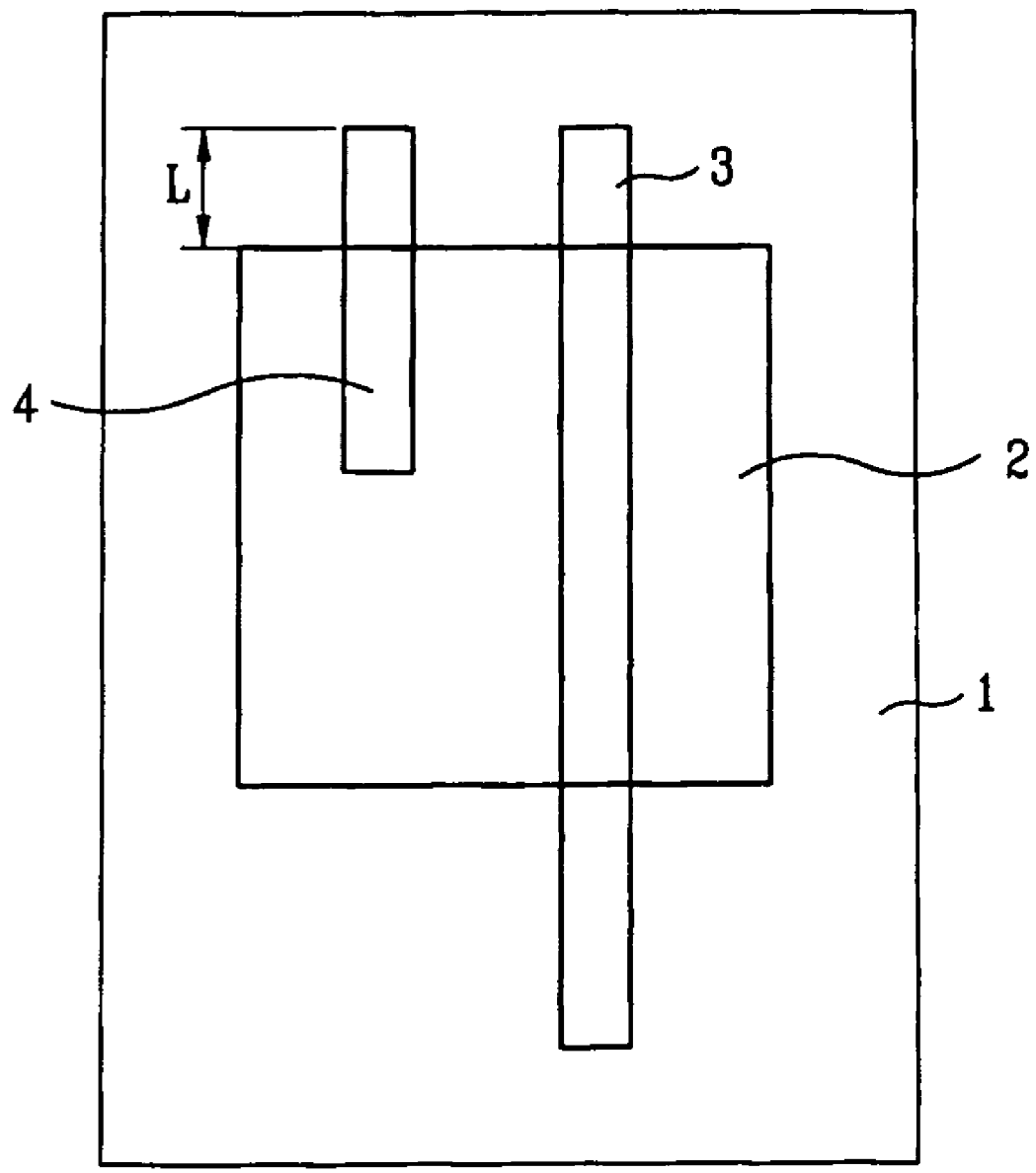
FIG. 1 is a layout of a mask according to a related art.
Figure 2:
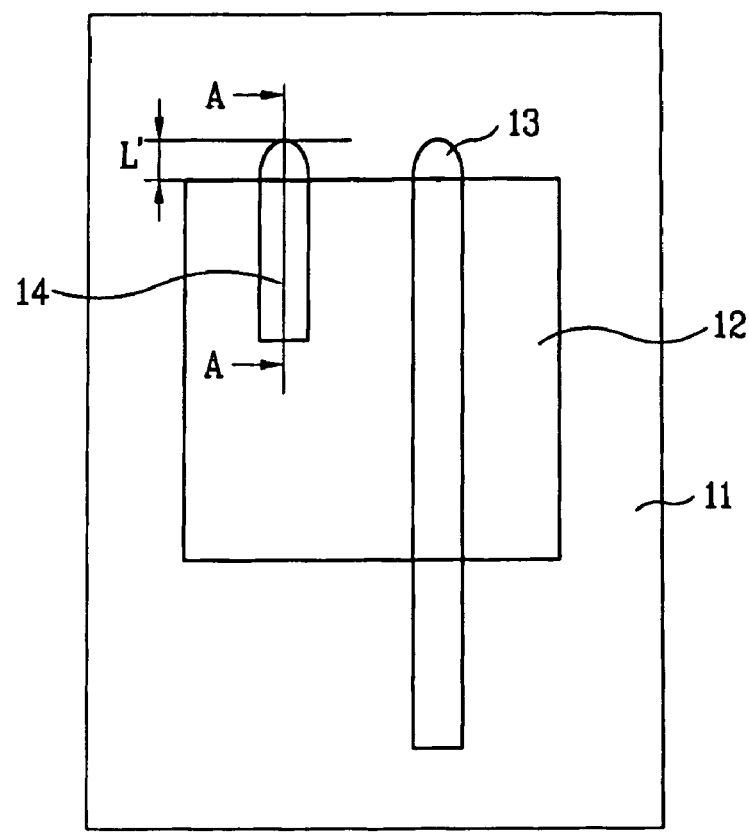
FIG. 2 is a layout of a semiconductor device formed using the mask in FIG. 1.
Figure 3:
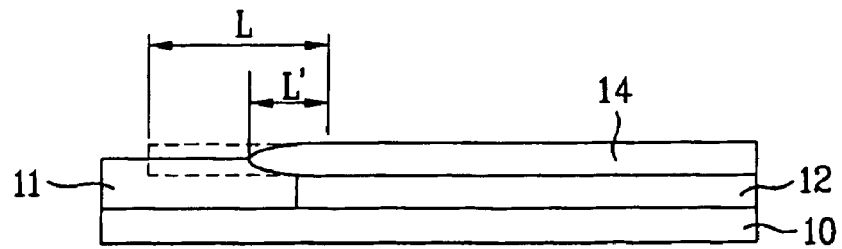
FIG. 3 is a cross-sectional diagram along a cutting line A-A in FIG. 2.
Figure 4:
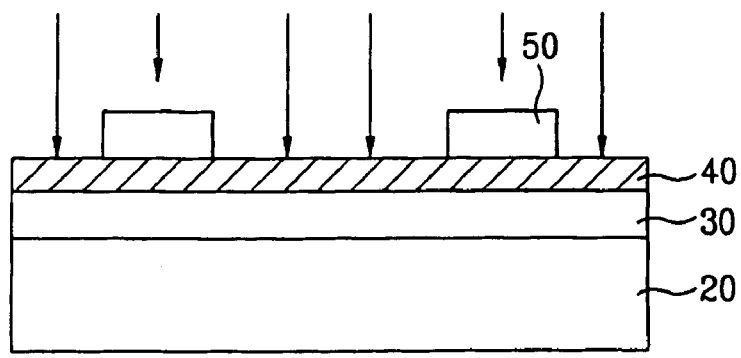
FIGS. 4 to 8 are cross-sectional diagrams for explaining a method of fabricating a phase shift mask according to the present invention.

Referring to FIG. 4, a phase shift layer 30 is formed on a transparent substrate 20 formed of MoSiN. And, a shield layer 40 formed of Cr is formed on the phase shift layer 30.

A photoresist layer is coated on the shield layer 40. The photoresist layer is then patterned into a specific shape to form a first photoresist pattern 50.

Subsequently, an exposed portion of the shield layer 40 is then etched by a dry etch process performed by an ICP (inductive coupled plasma) etch machine using the first photoresist pattern 50 as an etch mask.

Figure 5:
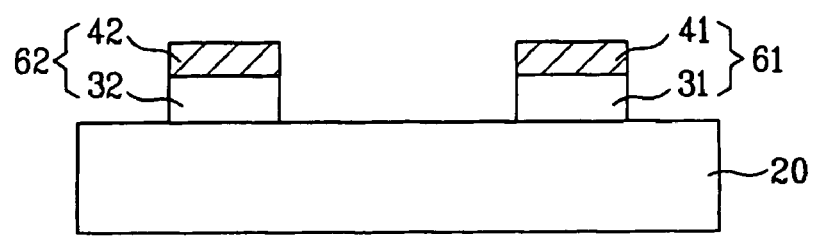

Referring to FIG. 5, as a result of the dry etch, shield patterns 41 and 42 are formed to expose a portion of the phase shift layer 30.

The exposed portion of the phase shift layer 30 is etched by the ICP etch machine using the first photoresist pattern 50 and the shield patterns 41 and 42 as an etch mask to form phase shift patterns 31 and 32.

The first photoresist pattern remaining on the shield patterns 41 and 42 is then removed.

Hence, a surface of the transparent substrate 20 is exposed except the portions of the transparent substrate 20 where the phase shift patterns 31 and 32 and the shield patterns 41 and 42 are formed.

Thus, the phase shift patterns 31 and 32 are combined with the shield patterns 41 and 42 to construct halftone layers 61 and 62, respectively.

Figure 6:
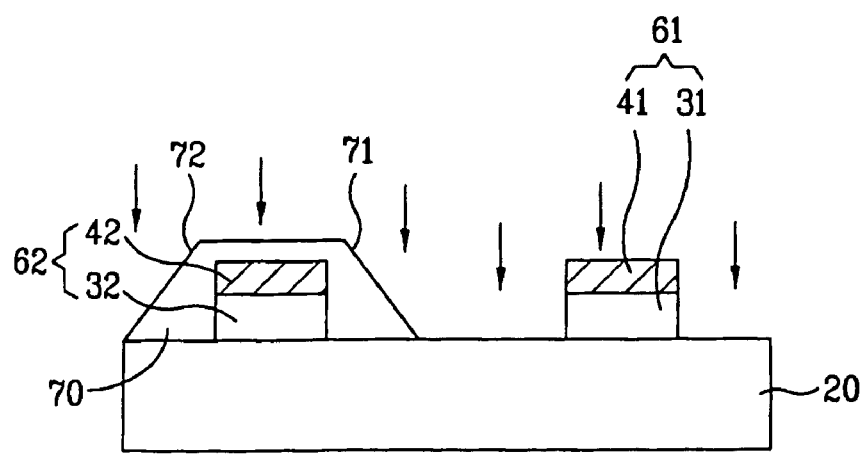

Referring to FIG. 6, photoresist is coated on the substrate 20 including the halftone layers 61 and 62 and is then selectively patterned to form a second photoresist pattern 70. In doing so, the second photoresist pattern 70 covers the halftone layer 62 and left and right side inclines 71 and 72. This is to form an incline having the same slope of the incline 71 of the second photoresist pattern 70 between etched and non-etched portions of the transparent substrate 20.

Specifically, the second photoresist pattern 70 is formed by dry etching. In order to form a slow (or low) slope of each of the inclines 71 and 72 of the second photoresist pattern 70 as far as the remaining real estate permits, hard baking is carried out by raising a temperature to a thermal flow enabling temperature after exposure. Thermal flow generally occurs at the temperature 50° C. higher than a normal temperature.

Figure 7:
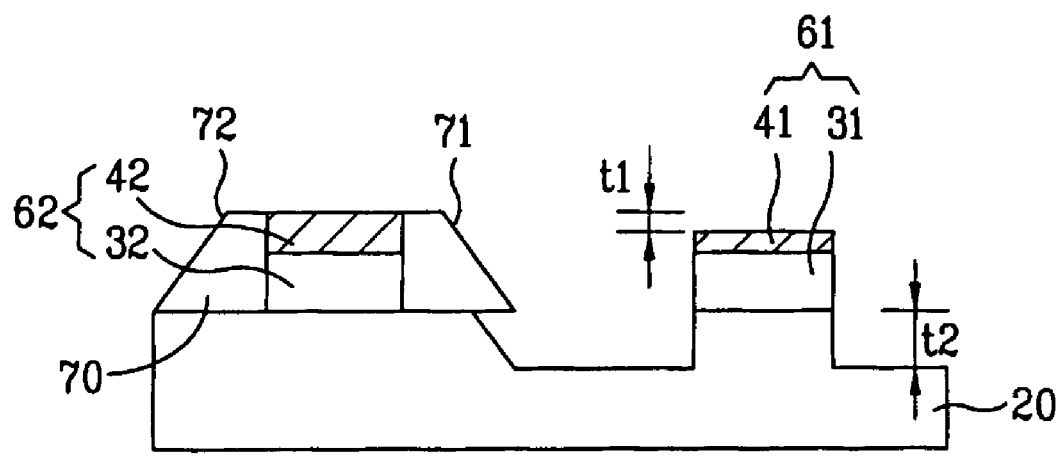

Referring to FIG. 7, surfaces of the exposed transparent substrate 20 and the halftone layer 61 that was originally covered with the second photoresist pattern 50 are etched to a thickness t1 of the transparent and a thickness t2 of the shield pattern 32 of the halftone layer 61. In doing so, an incline 72 having the same slope of the incline 71 of the second photoresist pattern 70 is formed on a boundary between the etched and non-etched portions of the transparent substrate 20 due to the incline 71 of the second photoresist pattern 70. Hence, it is able to prevent an abrupt inversion of phase shifting of a light according to the thickness difference between the etched and non-etched portions of the transparent substrate 20.

Figure 8:
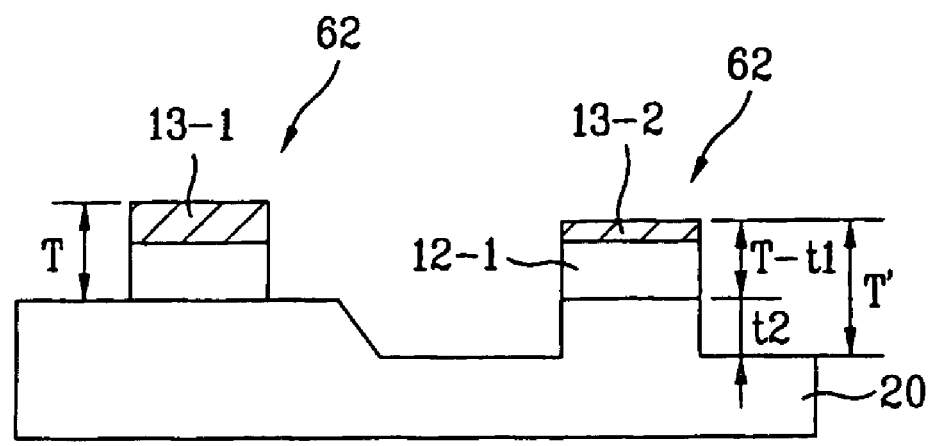

Referring to FIG. 8, the second photoresist pattern 70 covering the halftone layer 62 is removed to complete a mask.

A pattern of the mask according to the present invention is divided into two different parts differing in light transmittance.

Specifically, the halftone layer 62 having a thickness T has the light transmittance of 6% while the halftone layer 61 having a thickness (T-t1) has the light transmittance of 9%. Moreover, the part including the halftone layer 61 having a thickness (T-t1) also has the transparent substrate 20 etched to the thickness of t2, thereby having a phase shift effect as well.

Preferably, there exists a 2~8% light transmittance difference between the halftone layers 61 and 62 having different light transmittances. In the embodiment of the present invention, there exists a 3% light transmittance difference between the halftone layers 61 and 62.

Figure 9:
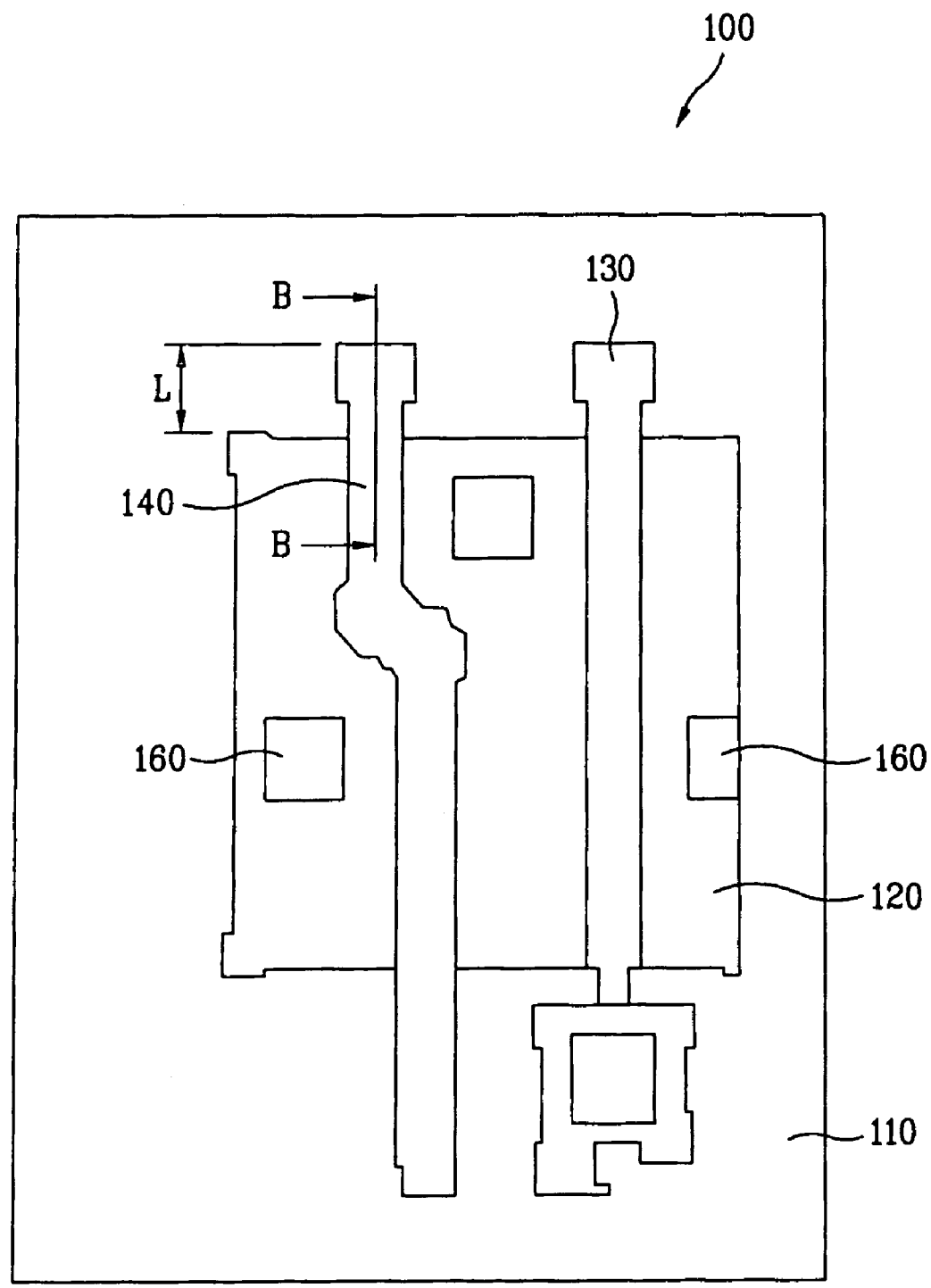
FIG. 9 is a layout of a semiconductor device to be fabricated using a mask according to the present invention.

FIG. 9 is a layout of a semiconductor device to be fabricated using a mask according to the present invention.

Referring to FIG. 9, a semiconductor device 100 includes an active area 120 formed on a silicon substrate 10, a pair of bar type gate patterns 130 and 140 on the active area 120, and an insulating layer 110 enclosing the active area 120. And, front ends of the gate patterns 130 and 140 extend from a boundary of the active area to externally protrude to a length L each. Each reference number 160 in FIG. 9 indicates a contact hole. The contact holes 160 are formed on the active area 120 after completion of the gate patterns 130 and 140. A cross-sectional shape along a cutting line B-B in FIG. 9 can be implemented by the phase shift mask having dual light transmittance according to the present invention.

Figure 10:
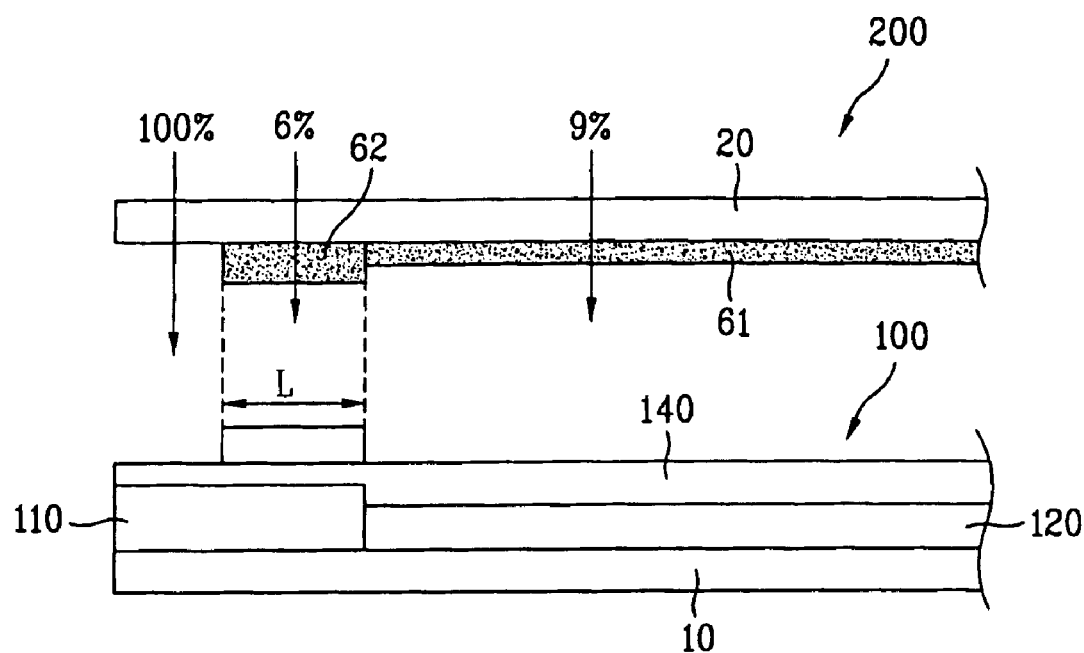
FIG. 10 is a cross-sectional diagram of a mask according to the present invention and the semiconductor device bisected along a cutting line B-B' in FIG. 9.

FIG. 10 is a cross-sectional diagram of a mask 200 according to the present invention and the semiconductor device 100 bisected along a cutting line B-B' in FIG. 9.

Referring to FIG. 10, a pair of halftone layers 62 and 61, differing in thickness, is formed in parallel on a transparent substrate 20 of a mask 200.

A semiconductor device 100 includes a silicon substrate 10, an insulating layer 110 on the substrate 10, an active layer 120 parallel to the insulating layer 110 on the substrate 10, and a conductor layer 140 for forming a gate pattern on the insulating layer 110 and the active layer 120.

An interface between the halftone layers 62 and 61 opposes an interface between the insulating layer 110 and the active area 120.

The halftone layer 62 thicker than the other halftone layer 61 has the same length L of a protruding length of a front end of a gate pattern. Namely, the thicker halftone layer 62 corresponds to the front end of the gate pattern 140 protruding from the boundary of the active area 120 in FIG. 9.

During exposure, light emitted from a light source (not shown in the drawing) over the mask 200 transmits the transparent substrate 20 by 100%, the thinner halftone layer 61 by 9%, and the thicker halftone layer 62 by 6%.

After photoresist is coated on the conductor layer 140, exposure is carried out using the mask 200. Development is then carried out.

Figure 11:
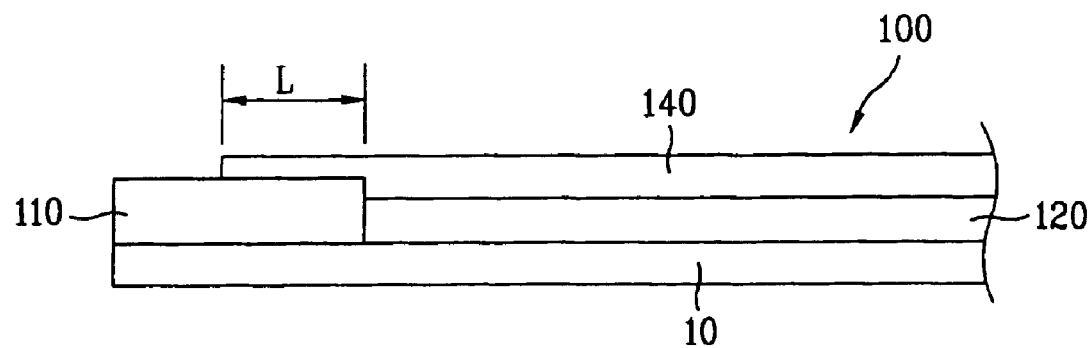
FIG. 11 is a cross-sectional diagram of a semiconductor device fabricated using the mask in FIG. 10.

As a result of the exposure and development, a portion of the conductor layer 140 that does not overlap with the halftone layers 62 and 61 of the mask 200, as shown in FIG. 11, is selectively removed.

Hence, despite the step difference between the active area 120 and the insulating layer 110, the front end of the gate pattern 140 protruding from the active area 120 of the length L can be formed as intended by design.

Accordingly, the present invention facilitates a critical dimension of a semiconductor pattern to be accurately formed in a manner of compensating a boundary step difference between an active area and an insulating layer, thereby enhancing pattern precision.

Therefore, a gate threshold voltage and a process margin of an active layer can be enhanced, whereby an overall process margin can be enhanced.

Moreover, the present invention enables selective radiation intensity adjustment by adjusting a thickness of the halftone layer.

This application claims the benefit of Korean Application No. P2003-0101888 filed on Dec. 31, 2003, the entire contents of which is hereby incorporated by reference.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a phase shift mask, comprising the steps of:
    forming a halftone layer on a transparent substrate;
    forming a first photoresist pattern on the halftone layer to define at least two areas;
    patterning the halftone layer using the first photoresist pattern so as to create a first halftone layer portion and a second halftone layer portion;
    removing the first photoresist pattern;
    forming a second photoresist pattern covering the first halftone layer portion, but not the second halftone layer portion on the transparent substrate;
    etching the second halftone layer portion and an exposed surface of the transparent substrate to a first thickness and a second thickness, respectively; and
    removing the second photoresist pattern,
    wherein the step of forming a second photoresist pattern includes forming a pair of inclined portions that cover respective sidewalls of the first halftone layer portion, said inclined portions having predetermined slopes.

2. The method of claim 1, wherein said predetermined slopes having a common slope angle, but different direction.

3. The method of claim 2, wherein an etched surface of the transparent substrate has a recessed incline having a same slope angle as the common slope angle.

4. The method of claim 1, the halftone layer forming step comprising the steps of: forming a phase shift layer on the transparent substrate; and forming a shield layer on the phase shift layer.

5. The method of claim 4, wherein the phase shift layer and the shield layer are formed on MoSiN and Cr, respectively.

6. A method of fabricating a phase shift mask, comprising steps for:
    forming a halftone layer on a transparent substrate;
    forming a first photoresist pattern on the halftone layer to define at least two areas;
    patterning the halftone layer using the first photoresist pattern so as to create a first halftone layer portion and a second halftone layer portion;
    removing the first photoresist pattern;
    forming a second photoresist pattern covering the first halftone layer portion, but not the second halftone layer portion on the transparent substrate;
    etching the second halftone layer portion and an exposed surface of the transparent substrate to a first thickness and a second thickness, respectively; and
    removing the second photoresist pattern,
    wherein the step for forming a second photoresist pattern includes forming a pair of inclined portions that cover respective sidewalls of the first halftone layer portion, said inclined portions having predetermined slopes.

* * * * *